United States Patent
Wu

(10) Patent No.: US 9,536,841 B2
(45) Date of Patent: Jan. 3, 2017

(54) SEMICONDUCTOR PACKAGE WITH CONFORMAL EM SHIELDING STRUCTURE AND MANUFACTURING METHOD OF SAME

(71) Applicant: CYNTEC CO., LTD., Hsinchu (TW)

(72) Inventor: Ming-Che Wu, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 14/814,525

(22) Filed: Jul. 31, 2015

(65) Prior Publication Data

US 2016/0035680 A1 Feb. 4, 2016

Related U.S. Application Data

(60) Provisional application No. 62/031,879, filed on Aug. 1, 2014, provisional application No. 62/078,933, filed on Nov. 12, 2014.

(51) Int. Cl.
| | |
|---|---|
| *H01L 21/00* | (2006.01) |
| *H01L 23/06* | (2006.01) |
| *H01L 23/48* | (2006.01) |
| *H01L 23/552* | (2006.01) |
| *H01L 21/78* | (2006.01) |
| *H01L 23/00* | (2006.01) |
| *H01L 23/498* | (2006.01) |
| *H01L 23/31* | (2006.01) |
| *H01L 21/56* | (2006.01) |

(52) U.S. Cl.
CPC ............ *H01L 23/552* (2013.01); *H01L 21/78* (2013.01); *H01L 24/97* (2013.01); *H01L 21/561* (2013.01); *H01L 23/3128* (2013.01); *H01L 23/49805* (2013.01); *H01L 23/49816* (2013.01); *H01L 2224/16227* (2013.01); *H01L 2224/81005* (2013.01); *H01L 2224/97* (2013.01); *H01L 2924/15159* (2013.01); *H01L 2924/15311* (2013.01); *H01L 2924/19105* (2013.01); *H01L 2924/3025* (2013.01)

(58) Field of Classification Search
CPC ............ H01L 23/552; H01L 23/49805; H01L 23/49827; H01L 23/49816; H01L 23/3128; H01L 21/565; H01L 21/78; H01L 21/4875
See application file for complete search history.

(56) References Cited

U.S. PATENT DOCUMENTS

| | | | |
|---|---|---|---|
| 2009/0236700 A1* | 9/2009 | Moriya | ............... H01L 23/29 257/659 |
| 2014/0048913 A1* | 2/2014 | Park | ................. H01L 23/552 257/659 |
| 2014/0110860 A1* | 4/2014 | Choi | ............... H01L 23/49816 257/774 |

* cited by examiner

*Primary Examiner* — Hsien Ming Lee
(74) *Attorney, Agent, or Firm* — Winston Hsu; Scott Margo

(57) ABSTRACT

A semiconductor package includes a substrate having a front side, a bottom side, and a sidewall along a perimeter of the substrate, a plurality of solder pads on the bottom side, at least one EM shielding contact structure on the bottom side and partially exposed on the sidewall, a semiconductor device mounted on the front side, a mold compound on the front side and covering the semiconductor device, and an EM shielding layer conformally covering the mold compound and the sidewall. The EM shielding layer is in direct contact with the exposed portion of the EM shielding contact structure on the sidewall.

15 Claims, 15 Drawing Sheets

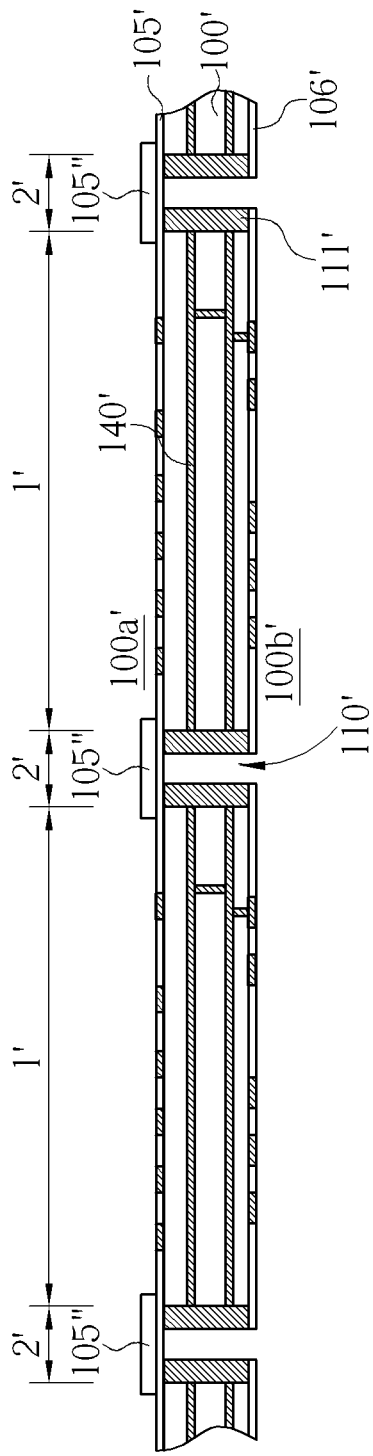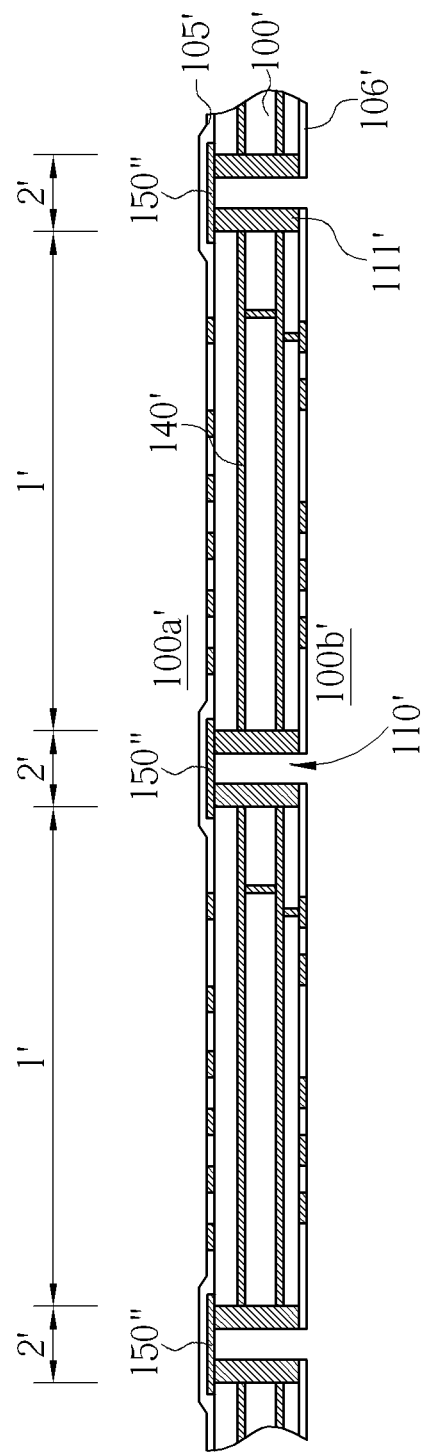

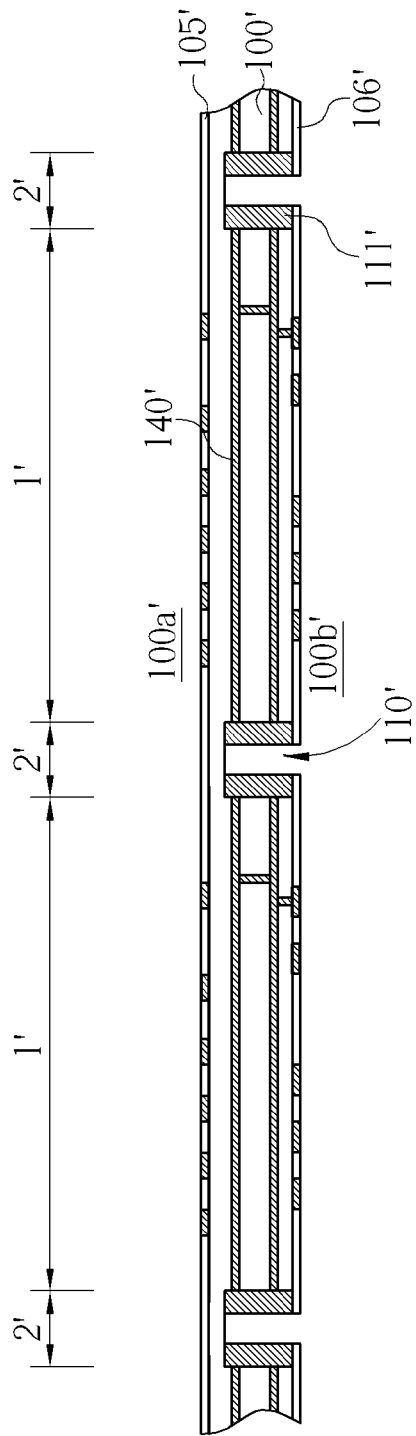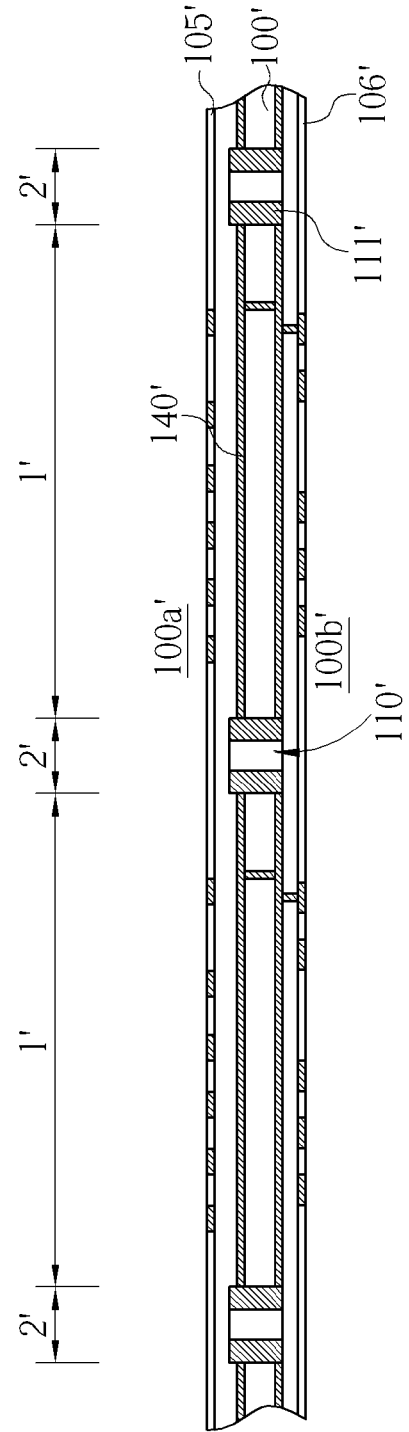

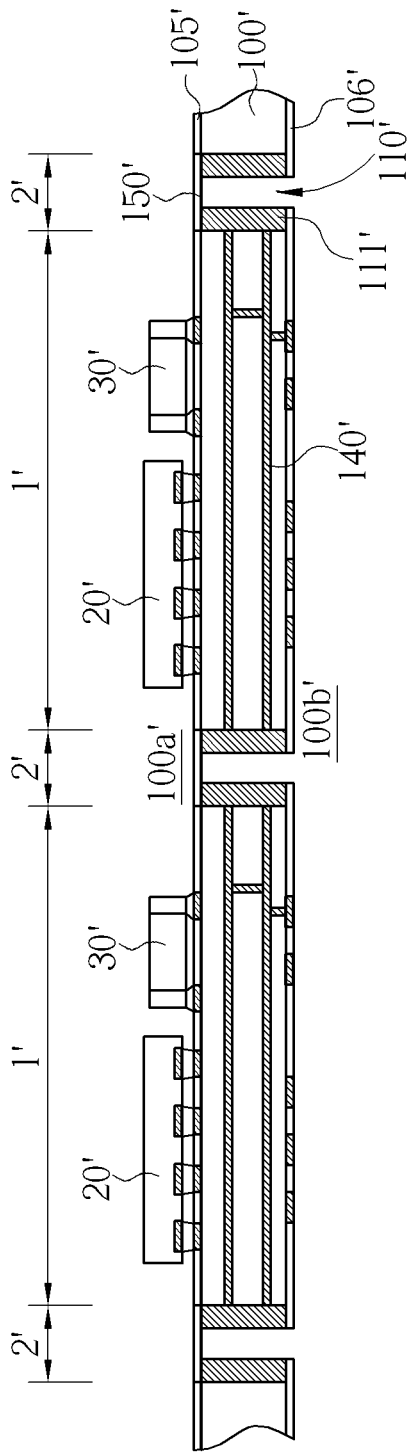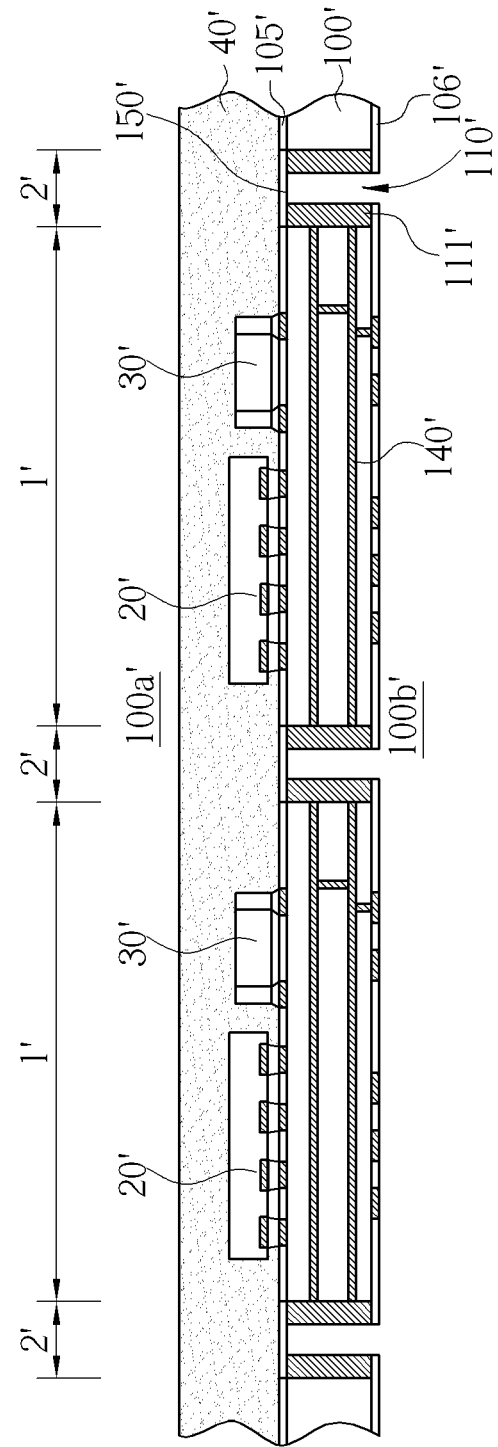

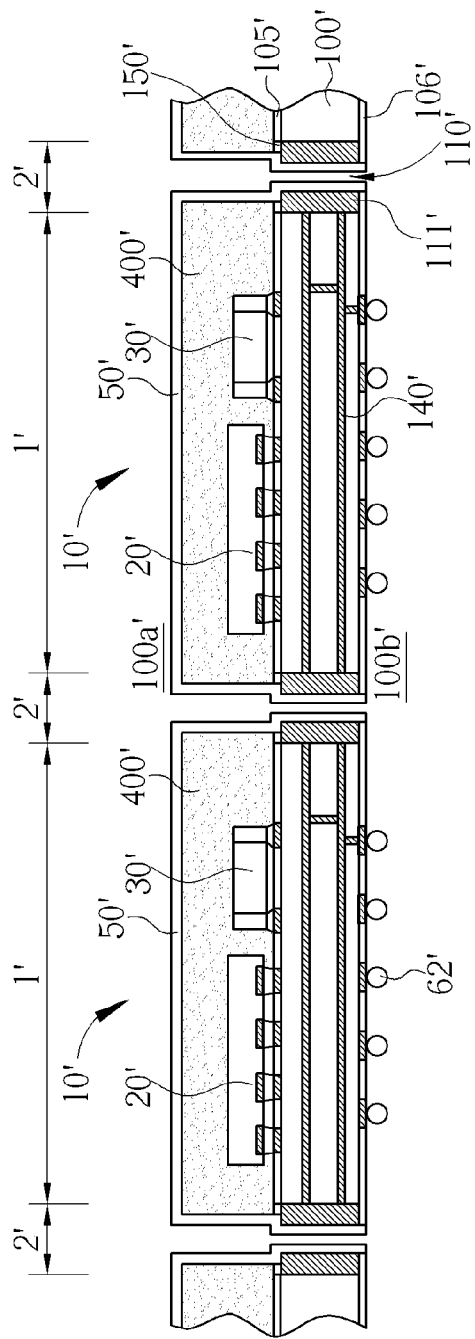
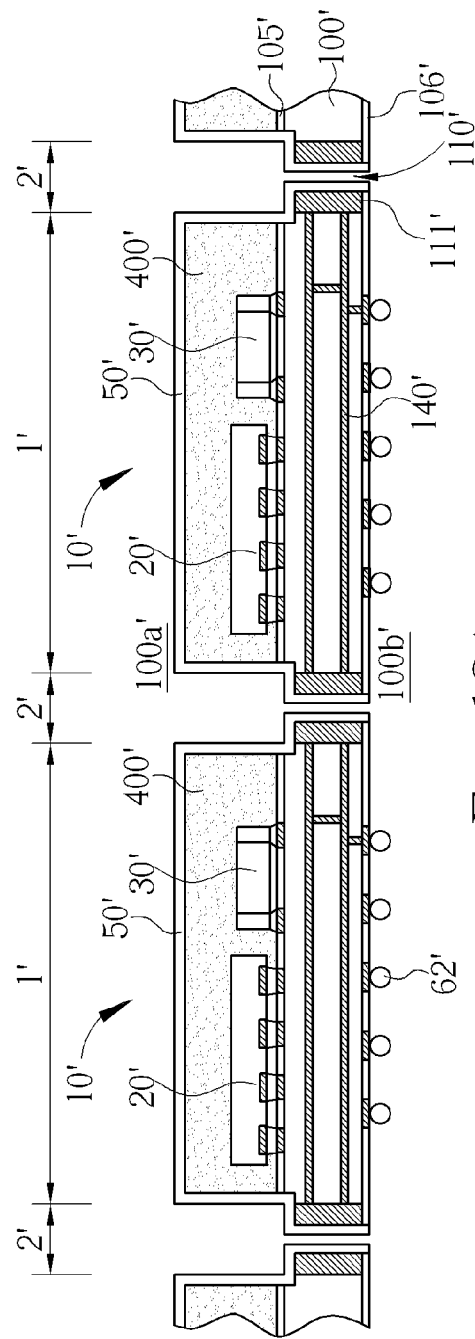
Fig. 13
Fig. 13A

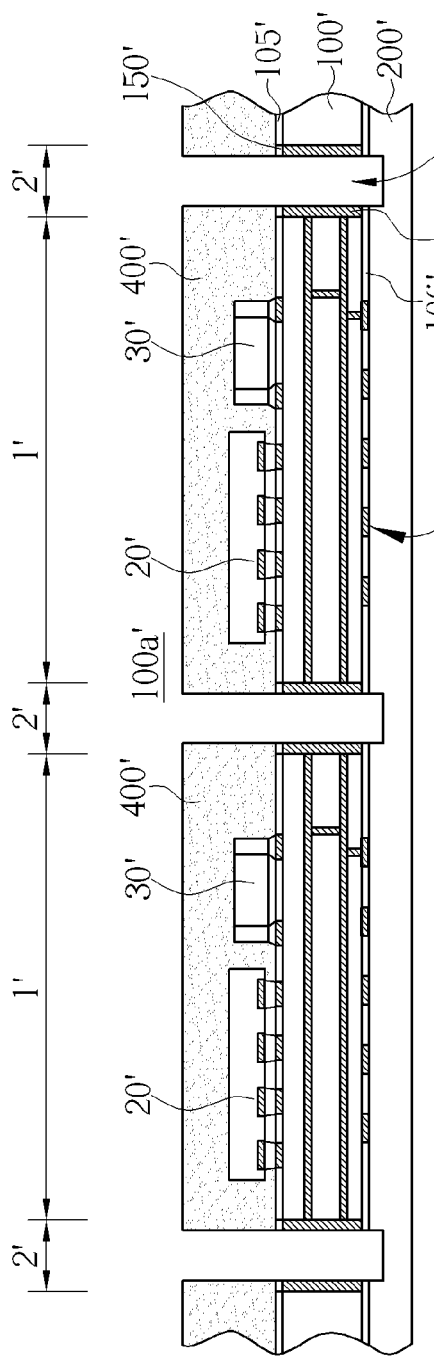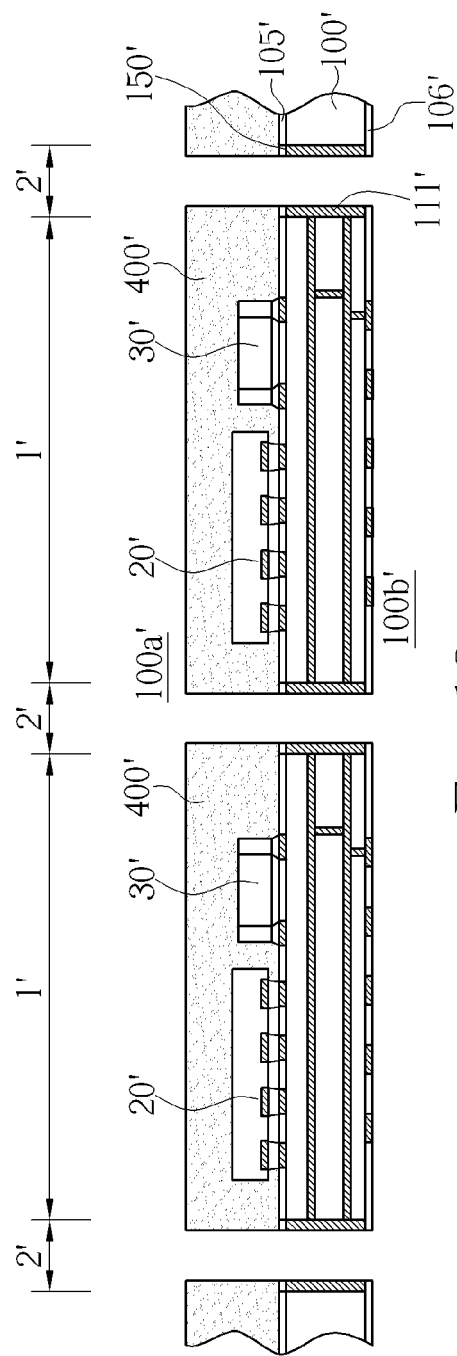

SEMICONDUCTOR PACKAGE WITH CONFORMAL EM SHIELDING STRUCTURE AND MANUFACTURING METHOD OF SAME

CROSS REFERENCE TO RELATED APPLICATIONS

This application claims priority from U.S. provisional application No. 62/031,879, filed Aug. 1, 2014 and U.S. provisional application No. 62/078,933, filed Nov. 12, 2014, which are incorporated herein in their entirety by reference.

BACKGROUND OF THE INVENTION

1. Field of the Invention

The present invention relates generally to the field of semiconductor packaging. More particularly, the present invention relates to a semiconductor package with conformal electromagnetic (EM) shielding structure and methods for manufacturing the same.

2. Description of the Prior Art

As known in the art, electronic components, such as radio frequency (RF) components, are easily interfered with by electromagnetic interference (EMI). Therefore, it is necessary or desirable to provide electromagnetic (EM) shielding for such components.

Typically, a conventional EM shielding structure includes a prefabricated metal lid mounted on a chip in order to achieve the EM shielding effect. However, the conventional EM shielding metal lid is designed and fabricated according to various modules or devices, and is therefore not cost-effective. The prefabricated metal lid is usually fixed on a surface of the substrate. Therefore, the prefabricated metal lid undesirably occupies larger surface area and does not provide adequate EM shielding effect.

Therefore, what is needed is to provide an improved EM shielding structure for the semiconductor packages that has greater reliability and that can be produced at lower cost, in order to overcome the prior art shortcomings.

SUMMARY OF THE INVENTION

It is one object of the invention to provide an improved semiconductor package with conformal electromagnetic (EM) shielding structure. The process for manufacturing the EM shielding structure is not complicated. The EM shielding structure does not occupy surface area of the substrate and has better EM shielding effect.

According to one embodiment of the invention, a semiconductor package includes a substrate having a front side, a bottom side, and a sidewall along a perimeter of the substrate, a plurality of solder pads on the bottom side, at least one EM shielding contact structure on the bottom side and partially exposed on the sidewall, a semiconductor device mounted on the front side, a mold compound on the front side and covering the semiconductor device, and an EM shielding layer conformally covering the mold compound and the sidewall. The EM shielding layer is in direct contact with the exposed portion of the EM shielding contact structure on the sidewall.

According to another embodiment, a method for manufacturing a semiconductor package is provided. A substrate with a front side and a bottom side is prepared. The substrate has a plurality of device regions thereon and a dicing region surrounding each of the device regions. A plurality of solder pads and at least one electromagnetic (EM) shielding pad structure are formed on the bottom side. A semiconductor device is mounted on the front side of the substrate. A mold compound is formed to completely cover the front side of the substrate. The mold compound covers the semiconductor device. A dicing process is performed to dice the mold compound and the substrate along the dicing region, thereby singulating a plurality of semiconductor packages and exposing a portion of the EM shielding contact structure from a sidewall of the substrate. A conformal EM shielding layer is formed on each of the semiconductor packages. The conformal EM shielding layer covers the mold compound and the sidewall of the substrate. The conformal EM shielding layer is in direct contact with the exposed portion of the EM shielding contact structure.

According to still another embodiment, a method for manufacturing a semiconductor package is provided. A substrate with a front side and a bottom side is prepared. The substrate has a plurality of device regions thereon and a dicing region surrounding each of the device regions. A plurality of via holes are provided within the dicing region, and a conductive layer is formed inside each of the via holes. The conductive layer is in direct contact with and electrically connected to a ground layer in the substrate. The via holes are sealed by a cap layer on the front side of the substrate. A semiconductor device is mounted on the front side of the substrate. A mold compound is formed to completely cover the front side of the substrate. The mold compound covers the semiconductor device. A first dicing process is performed to cut through the mold compound and the cap layer along the dicing region, thereby exposing the conductive layer and forming a plurality of mold bodies. A conformal EM shielding layer is formed on each of the plurality of mold bodies. The conformal EM shielding layer fills into the via holes and is electrically connected to the conductive layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 8-13 are schematic, cross-sectional diagrams showing an exemplary method for manufacturing a semiconductor package with a conformal EM shielding structure in accordance with another embodiment of the invention.

FIG. 8A illustrates a dual-layer solder mask structure by screen printing another solder mask on the via hole.

FIG. 8B illustrates a cap layer sealing one end of the via hole and the cap layer is covered with a solder mask.

FIG. 8C illustrates that the via hole is a blind via.

FIG. 8D illustrates that the via hole is a buried via.

FIG. 13A is a schematic, cross-sectional diagram showing an exemplary method for manufacturing a semiconductor package with a conformal EM shielding structure, wherein the dicing width during the first dicing process may be equal to or greater than the via diameter of each of the via holes.

FIGS. 15-17 are schematic, cross-sectional diagrams showing an exemplary method for manufacturing a semiconductor package with a conformal EM shielding structure in accordance with still another embodiment of the invention.

Figure 1:
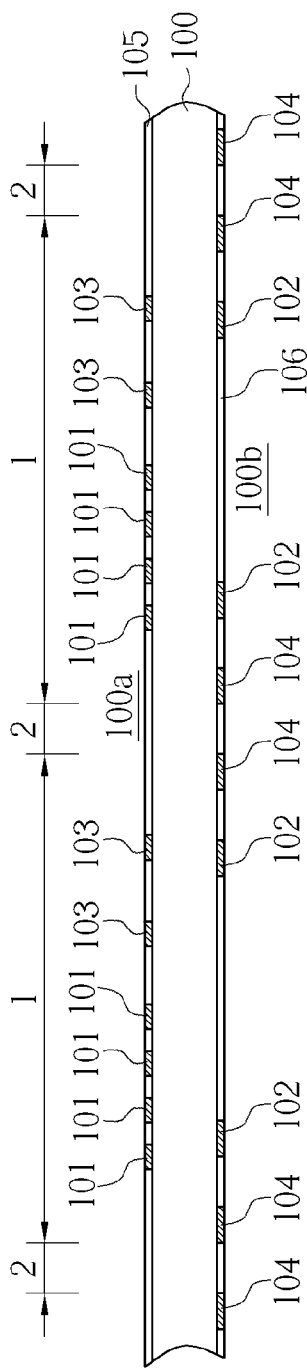
FIGS. 1-5 are schematic, cross-sectional diagrams showing an exemplary method for manufacturing a semiconductor package with a conformal EM shielding structure in accordance with one embodiment of the invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The drawings showing embodiments of the apparatus are semi-diagrammatic and not to scale and, particularly, some of the dimensions are for the clarity of presentation and are shown exaggerated in the figures. Also, where multiple embodiments are disclosed and described having some features in common, for clarity and ease of illustration and description thereof like or similar features one to another will ordinarily be described with like reference numerals.

FIGS. 1-5 are schematic, cross-sectional diagrams showing an exemplary method for manufacturing a semiconductor package with a conformal EM shielding structure in accordance with one embodiment of the invention. As shown in FIG. 1, a substrate 100 is provided. For example, the substrate 100 may be a package substrate or a circuit board with wiring layers fabricated therein or thereon. The substrate 100 has a front side 100a and a bottom side 100b. According to the embodiment of the invention, the front side 100a of the substrate 100 may be referred to as a "chip side", while the bottom side 100b of the substrate 100 may be referred to as a "PCB side", but not limited thereto. A solder mask 105 may be formed on the front side 100a of the substrate 100. A solder mask 106 may be formed on the bottom side 100b of the substrate 100.

According to the embodiment of the invention, the substrate 100 comprises a plurality of device regions 1 thereon. A dicing region 2 surrounds each of the device regions 1.

According to the embodiment of the invention, a plurality of solder pads 102 and at least one electromagnetic (EM) shielding contact structure 104 are formed on the bottom side 100b of the substrate 100. According to the embodiment of the invention, the plurality of solder pads 102 may be arranged in an array. According to the embodiment of the invention, the EM shielding contact structure 104 is a bond pad located on the bottom side 100b of the substrate 100. According to the embodiment of the invention, the EM shielding pad structure 104 may be electrically connected to a ground pad through a conductive via in the substrate 100.

Figure 5:
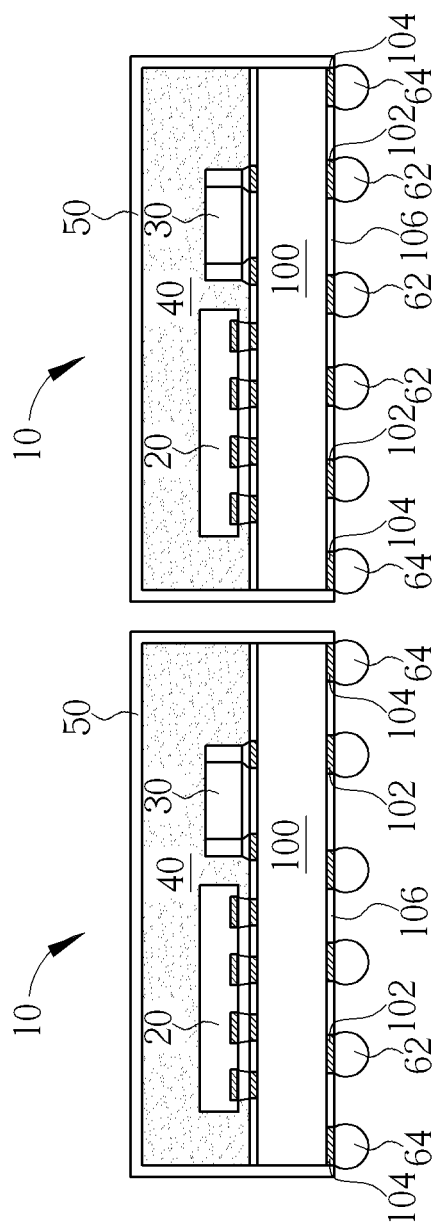
Figure 6:
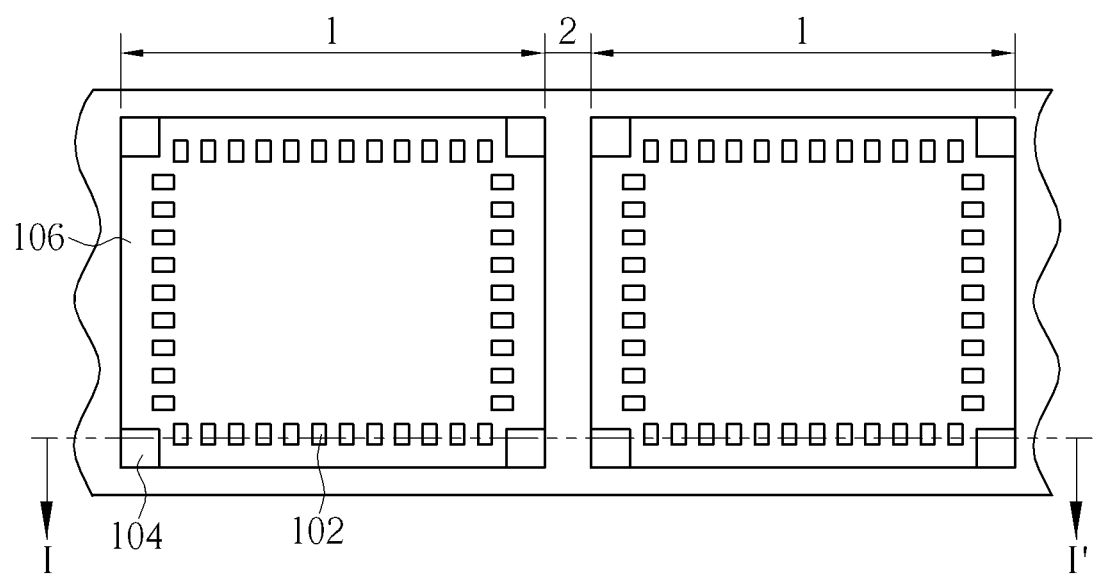
FIG. 6 is a plan view showing a portion of the bottom side of the substrate, wherein an exemplary layout of the solder pads and the EM shielding contact structures is demonstrated.

Please also refer to FIG. 6, which is a plan view showing a portion of the bottom side 100b of the substrate 100. In FIG. 6, an exemplary layout of the solder pads 102 and the EM shielding contact structures 104 is demonstrated. As shown in FIG. 6, according to the embodiment of the invention, the plurality of solder pads 102 are disposed along the perimeter of the device region 1, but the solder pads 102 are kept a distance away from the perimeter of the device region 1. For the sake of simplicity, only one row of the solder pads 102 along the perimeter of the active region 1 is shown in the figure. It is to be understood that multiple rows of the solder pads 102 may be arranged in the active region 1. FIG. 1 to FIG. 5 may be cross-sectional views taken along line I-I' in FIG. 6.

In FIG. 6, the four EM shielding contact structures 104 are located at the four corners of the each of the device region 1 respectively, and are contiguous with the perimeter of the device regions 1 or directly disposed on the edges. It is to be understood that the EM shielding contact structures 104 are not necessary disposed at the four corners of the device region 1. For example, the EM shielding contact structures 104 may be disposed along any edge of the device region 1. Further, it is not necessary to dispose the EM shielding contact structures 104 in every corner. In some cases, only one of the four corners is arranged with an EM shielding contact structure 104.

According to the embodiment of the invention, the EM shielding contact structures 104 may be covered with the solder mask 106 on the bottom side 100b of the substrate 100. However, in some embodiments, the EM shielding contact structures 104 may be not covered by the solder mask 106 and may be exposed, like the plurality of solder pads 102.

Figure 2:
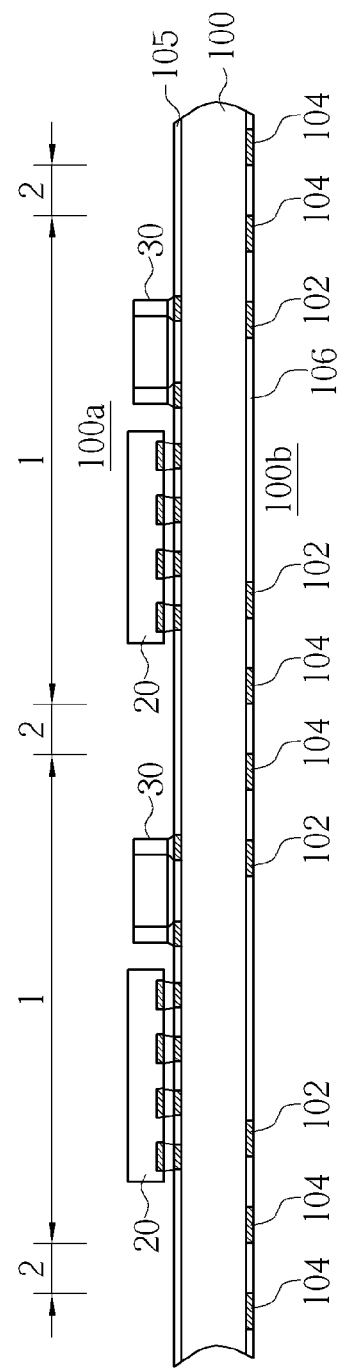

As shown in FIG. 2, semiconductor devices such as a chip 20 and a device 30 are mounted onto the front side 100a of the substrate 100. The chip 20 may be a wafer level chip scale package (WLCSP), but not limited thereto. According to the embodiment of the invention, the device 30 may be a passive device, for example, an inductor, a resistor, or a capacitor, but not limited thereto. According to the embodiment of the invention, the chip 20 or device 30 may be mounted on the solder pads 101 and 103 respectively, by using surface mounting technology (SMT) to electrically connect to internal wiring layers of the substrate 100, but not limited thereto.

Figure 3:
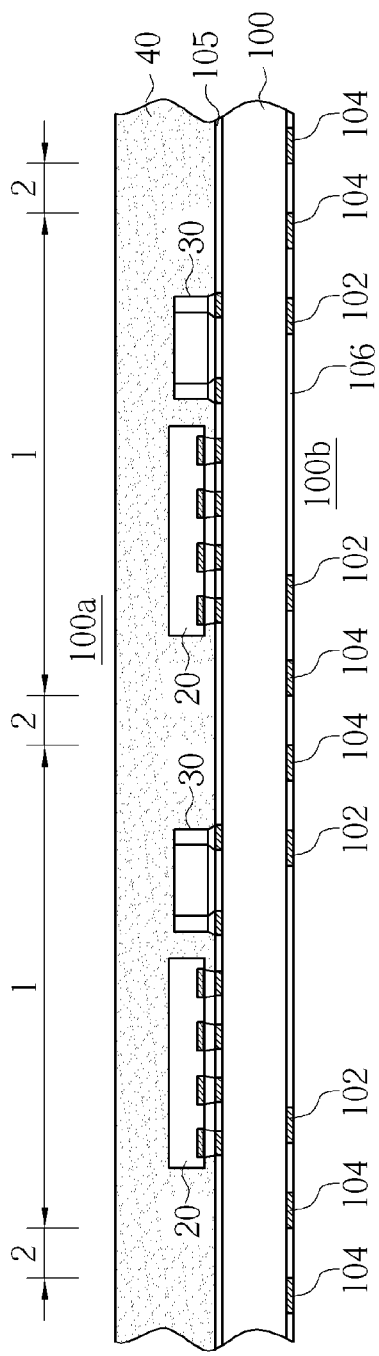

As shown in FIG. 3, a mold compound 40 such as epoxy mold compound is formed on the front side 100a of the substrate 100. According to the embodiment of the invention, the mold compound 40 completely covers the front side 100a of the substrate 100 including the device regions 1 and the dicing region 2. The mold compound 40 also covers the chip 20 and device 30 mounted on the front side 100a of the substrate 100.

Figure 4:
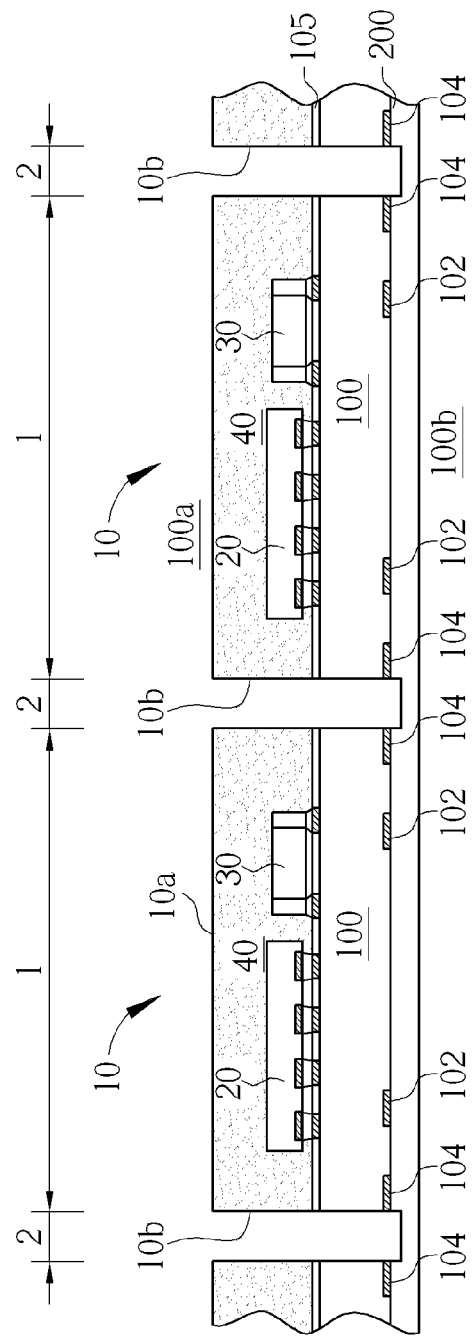
Figure 7:
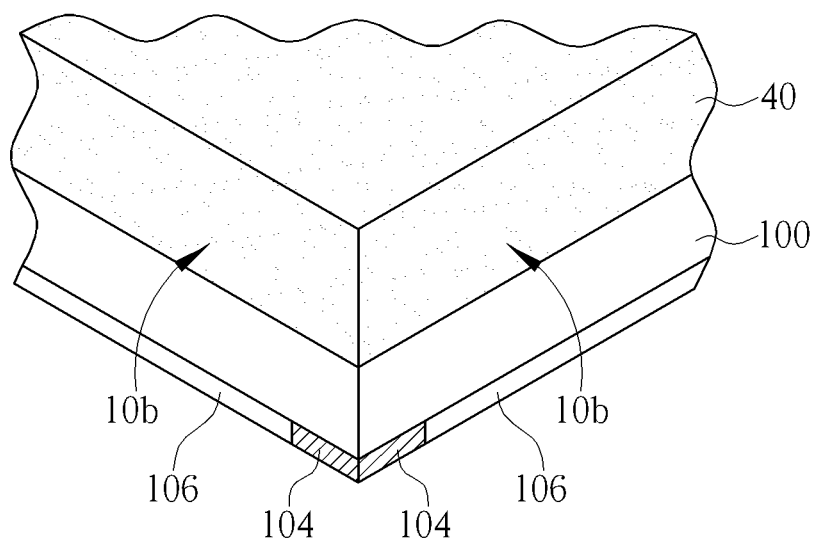
FIG. 7 is a perspective view showing a portion of the semiconductor package, wherein the exposed EM shielding contact structure on the sidewalls is demonstrated.

As shown in FIG. 4, a dicing process using blade sawing, wire sawing, or laser is performed to dice along the dicing region 2 to thereby singulate a plurality of semiconductor packages 10. During the above-described dicing process, the bottom side 100b of the substrate 100 may be adhered to a carrier film 200. The cutting depth may be deeper than the bottom side 100b of the substrate 100 to completely separate the mold bodies from one another (full cut). A cutting trench corresponding to the dicing region 2 may be seen on the carrier film 200. At this point, the semiconductor package 10 comprises a top surface 10a and four sidewalls 10b. The EM shielding contact structures 104 are exposed from the sidewalls 10b, as shown in FIG. 7. The two adjacent surfaces of each of the EM shielding contact structures 104 are exposed from the sidewalls 10b.

Figure 7A:
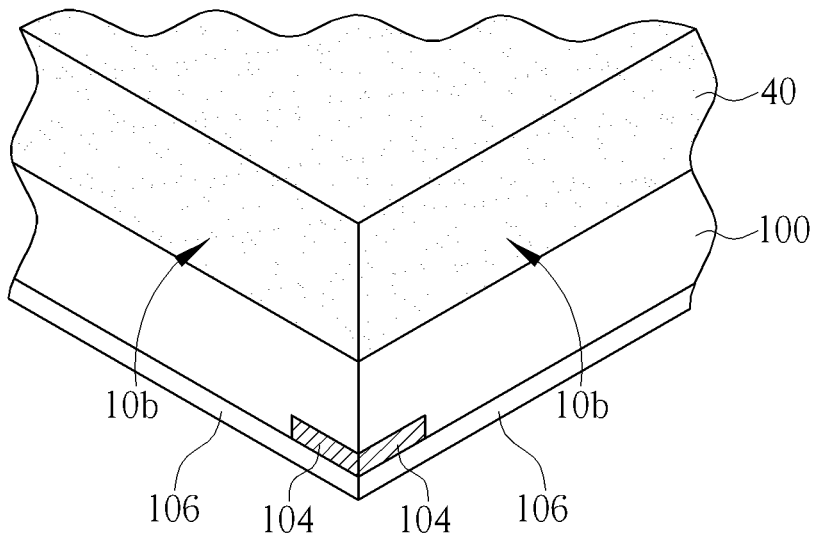
FIG. 7A is a perspective view showing a portion of the semiconductor package, wherein the exposed EM shielding contact structure on the sidewalls is demonstrated, wherein the bottom of the EM shielding contact structure is covered by the solder mask.

As shown in FIG. 5, an EM shielding layer 50 is conformally formed on the top surface 10a and four sidewalls 10b of the semiconductor package 10. According to the embodiment of the invention, the EM shielding layer 50 may be formed by using spraying methods, sputtering methods, electroplating methods, evaporating methods, or the like, and may comprise a conductive material, for example, a copper layer or a silver paste, but not limited thereto. The EM shielding layer 50 may further comprise a protective film such as epoxy resin. Finally, a plurality of bumps or balls (solder bumps or solder balls) 62/64 may be formed on the bottom side 100b of the substrate 100. The balls 62 are formed on the solder pads 102 and the balls 64 are formed on the EM shielding contact structures 104. In a case that the bottom of the EM shielding contact structures 104 is covered by the solder mask, as shown in FIG. 7A, then no bump or ball is formed on the EM shielding contact structures 104. According to the embodiment of the invention, the EM shielding layer 50 is in direct contact with and electrically connected to the EM shielding contact structures 104 exposed from the sidewalls 10b.

Figure 5B:
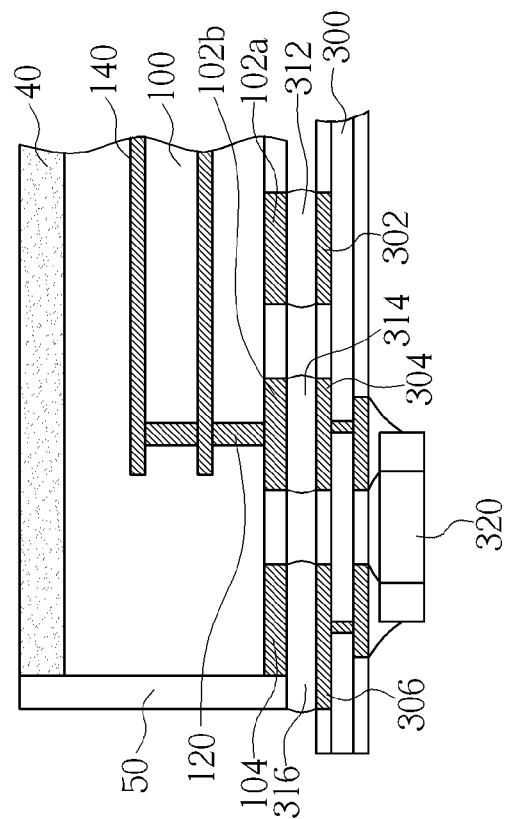
FIG. 5B is an enlarged view showing the EM shielding contact structure that is electrically connected to the EM shielding layer is not connected to the ground layer in the substrate.
Figure 5A:
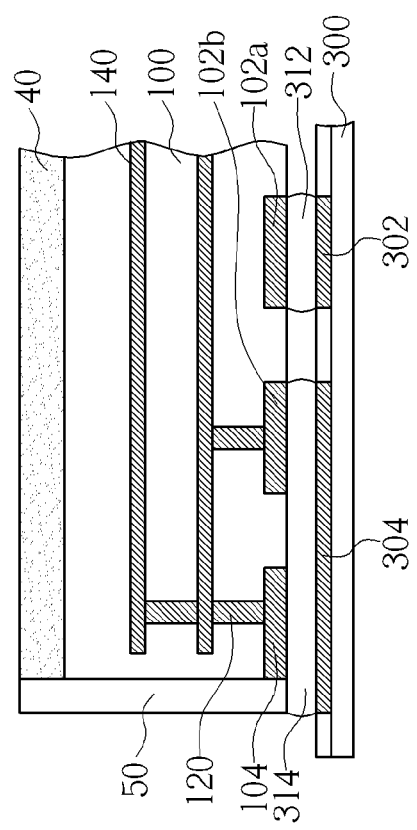
FIG. 5A is an enlarged view showing the conductive via in the substrate, and the EM shielding contact structure that is electrically connected to the ground layer through the conductive via.

According to the embodiment of the invention, as shown in the enlarged view of FIG. 5A, the EM shielding contact structure 104 may be electrically connected to the ground layer 140 in the substrate 100 though the conductive via 120 in the substrate 100. According to the embodiment of the invention, the power pad 102a is electrically connected to the system power pad 302 on the system PCB 300 through a solder ball 312. The EM shielding contact structure 104 and the ground pad 102b are commonly connected to the system ground pad 304 on the system PCB 300 through a solder ball 314. The EM shielding contact structure 104 extending along the soldering surface of the module can improve poor soldering and improve electromagnetic shielding effect.

According to another embodiment of the invention, as shown in the enlarged view of FIG. 5B, the EM shielding contact structure 104 that is electrically connected to the EM shielding layer 50 is not connected to the ground layer 140 in the substrate 100. In other words, the EM shielding contact structure 104 and the ground pad 102b in the substrate 100 are structurally and electrically independent and separated from each other. By providing such configuration, when the semiconductor package 10 is mounted on the system PCB 300, the ground signal interference in the substrate 100 can be avoided.

In this embodiment, the power pad 102a is electrically connected to the system power pad 302 on the system PCB 300 through a solder ball 312, the ground pad 102b is electrically connected to the system ground pad 304 on the system PCB 300 through a solder ball 314, and the EM shielding contact structure 104 is electrically connected to the system EM shielding pad 306 through a solder ball 316. Designers can use layout of the system PCB or electrical coupling of at least one filter device to facilitate separation of the two signals or reduction of interference between the two signals.

Optionally, a filter device 320, for example, a high-frequency inductor, may be electrically connected between the system ground pad 304 and the system EM shielding pad 306 of the system PCB 300, which are electrically connected to the ground pad 102b and the EM shielding contact structure 104, respectively. The filter device 320 on the system PCB 300 facilitates separation of the two signals or reduction of interference between the two signals. The filter device 320 may be mounted on the other side of the system PCB 300 by using surface mounting technology, but not limited thereto. Optionally, a filter device (not shown) may be disposed in the substrate 100 of the semiconductor package 10. The filter device may be electrically connected to a solder pad of the substrate 100 such that at least one filter device is electrically connected between the EM shielding contact structure and the ground pad. For example, a ground pad electrically connected to an electrode of the filter device is electrically connected to the EM shielding contact structure through the conductive via and ground layer. Similarly, a ground pad electrically connected to the other electrode of the filter device is electrically connected to the ground pad through the conductive via and the ground layer.

FIGS. 8-13 are schematic, cross-sectional diagrams showing an exemplary method for manufacturing a semiconductor package with a conformal EM shielding structure in accordance with another embodiment of the invention, wherein like numeral numbers designate like regions, elements, or layers.

Figure 8:
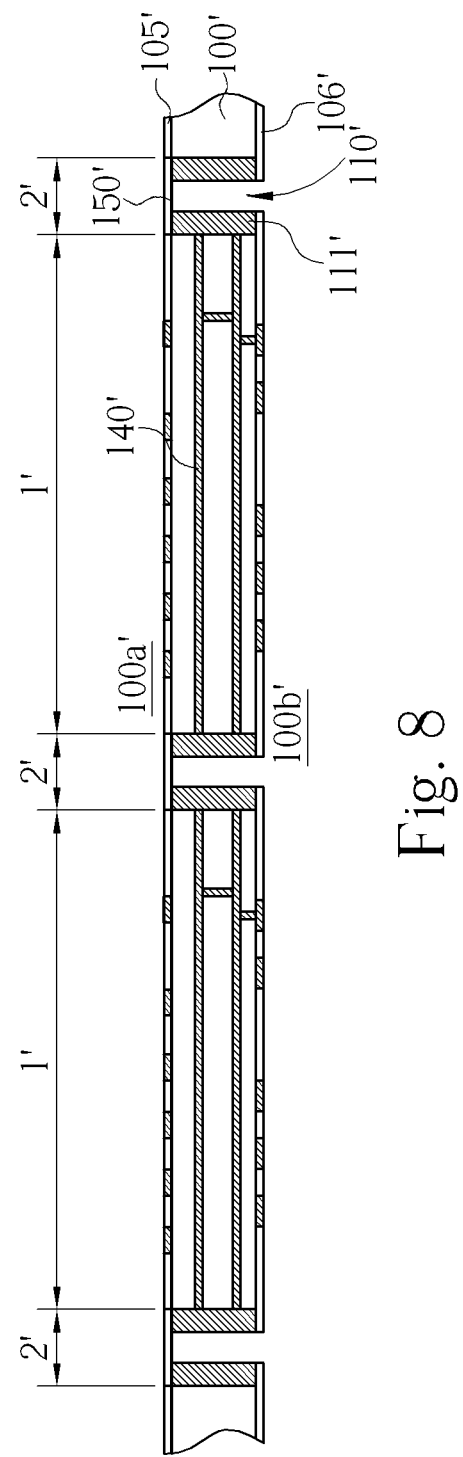
Figure 14:
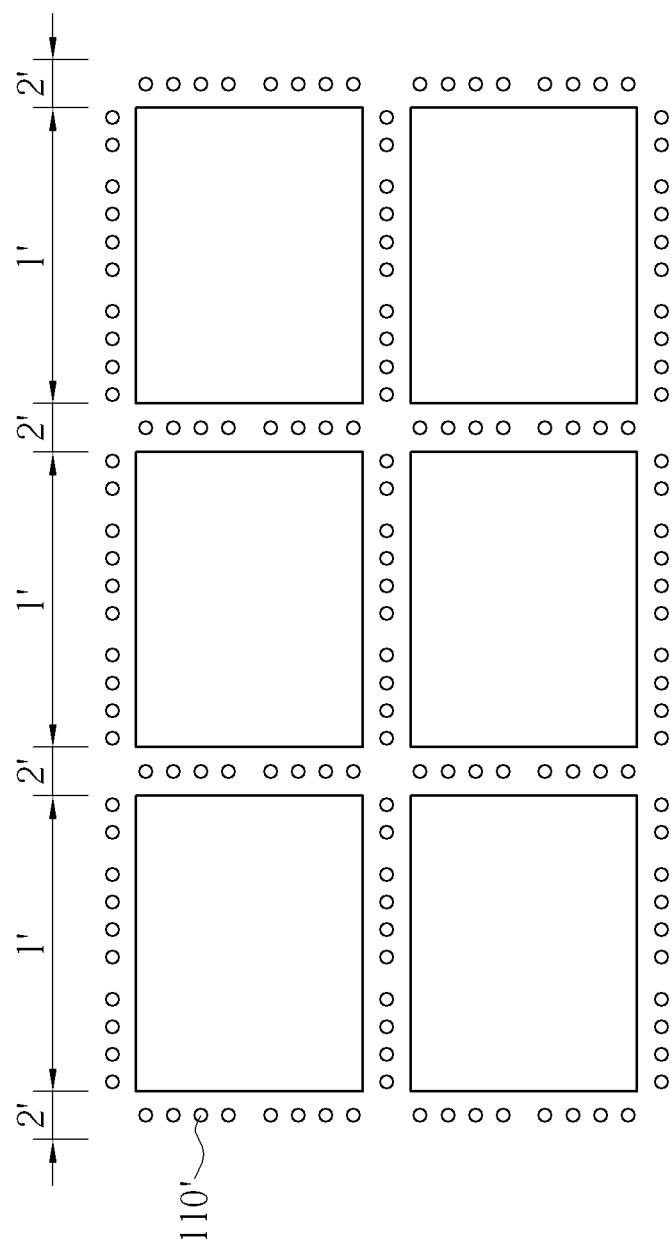
FIG. 14 is a plan view of the bottom side of the substrate in FIG. 1, wherein the device, dicing regions, and via holes within the dicing regions are illustrated.

First, as shown in FIG. 8, a substrate 100' is provided. For example, the substrate 100' may be a package substrate or a circuit board with wiring layers fabricated therein or thereon. The substrate 100' has a front side 100a' and a bottom side 100b'. Likewise, the substrate 100' comprises a plurality of device regions 1' thereon. A dicing region 2' surrounds each of the device regions 1'. A solder mask 105' may be formed on the front side 100a' of the substrate 100'. A solder mask 106' may be formed on the bottom side 100b' of the substrate 100'. A plurality of via holes 110' are provided within the dicing region 2' of the substrate 100', as shown in FIG. 14. A conductive layer 111', for example, copper, is formed on the interior surface of each of the via holes 110'. For example, the conductive layer 111' may be formed by using electroplating processes.

According to the embodiment of the invention, the substrate 100' is not penetrated by the via holes 110'. Therefore, the via holes 110' do not communicate between the front side 100a' and the bottom side 100b'. According to the embodiment of the invention, the via holes 110' is covered with a cap layer 150', for example, a copper foil or solder mask, on the front side 100a' of the substrate 100'. The cap layer 150' may be part of the solder mask 105'. When the solder mask 105' is formed by using screen printing methods, the cap layer 150' may be formed directly on each of the via holes 110' to thereby seal each of the via holes 110' by the cap layer 150' of the solder material.

In another embodiment, as shown in FIG. 8A, the cap layer is the solder mask 105' and a second solder mask 105" may be screen printed directly above each of the via holes 110' on the solder mask 105', to thereby forming a dual-layer solder mask structure. In still another embodiment, as shown in FIG. 8B, to enhance the structural strength, before screen printing the solder mask 105', a reinforced cap layer 150", including but not limited to copper, is disposed directly on each of the via holes 110'. Subsequently, the solder mask 105' is screen printed such that the cap layer 150" is covered with the solder mask 105'. According to the embodiment of the invention, the conductive layer 111' formed inside each of the via holes 110' is in direct contact with and electrically connected to the ground layer 140' in the substrate 100'. In addition, as shown in FIG. 8C and FIG. 8D, the via holes 110' may be blind holes and buried holes, respectively.

As shown in FIG. 9, subsequently, semiconductor devices such as a chip 20' and a device 30' are mounted onto the front side 100a' of the substrate 100'. The chip 20' may be a wafer level chip scale package (WLCSP), but not limited thereto. According to the embodiment of the invention, the device 30' may be a passive device, for example, an inductor, a resistor, or a capacitor, but not limited thereto. According to the embodiment of the invention, the chip 20' or device 30' may be mounted on the front side 100a' of the substrate 100' by using surface mounting technology, but not limited thereto.

As shown in FIG. 10, a mold compound 40' such as epoxy mold compound is formed on the front side 100a' of the substrate 100'. According to the embodiment of the invention, the mold compound 40' completely covers the front side 100a' of the substrate 100' including the device regions 1' and the dicing region 2'. The mold compound 40' also covers the chip 20' and device 30' mounted on the front side 100a' of the substrate 100'. Since the via holes 110' are sealed by the cap layer 150', the mold compound 40 does not flow into the via holes 110'.

Figure 11:
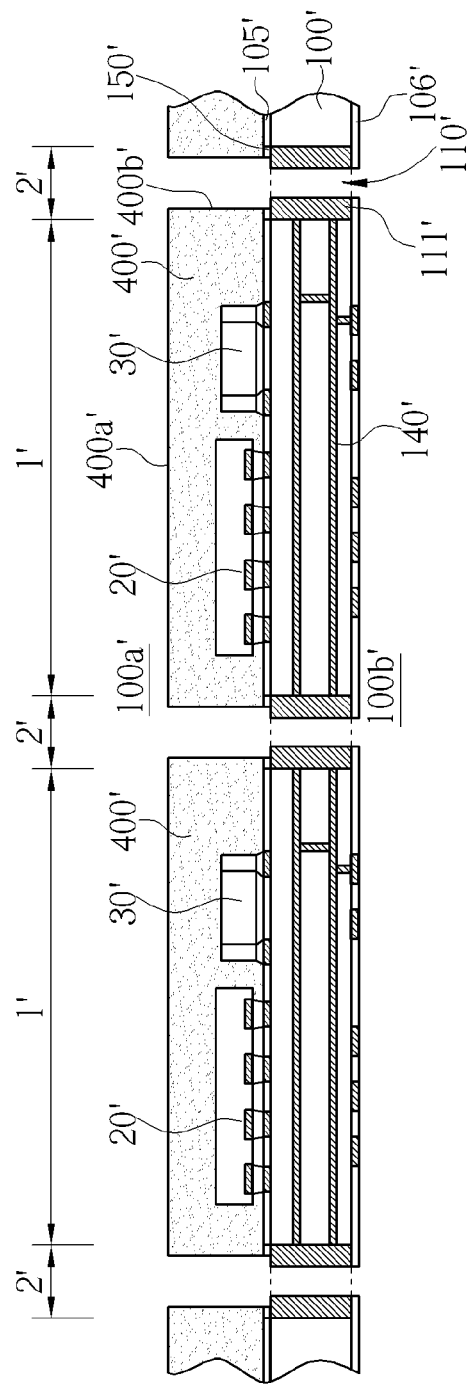

As shown in FIG. 11, a first dicing process using blade sawing, wire sawing, or laser is performed to dice along the dicing region 2' to merely cut the mold compound 40' until the conductive layer 111' inside the via holes 110' is exposed. In other words, the aforesaid first dicing process is performed to cut the mold compound 40' to a predetermined depth to thereby dice the cap layer 150' so that the conductive layer 111' inside the via holes 110' is exposed. At this stage, the device regions 1' of the substrate 100' are not separated from one another. The mold compound 40' is diced into plurality of mold bodies 400'. Each of the mold bodies 400' has a top surface 400a' and four sidewalls 400b'.

Figure 12:
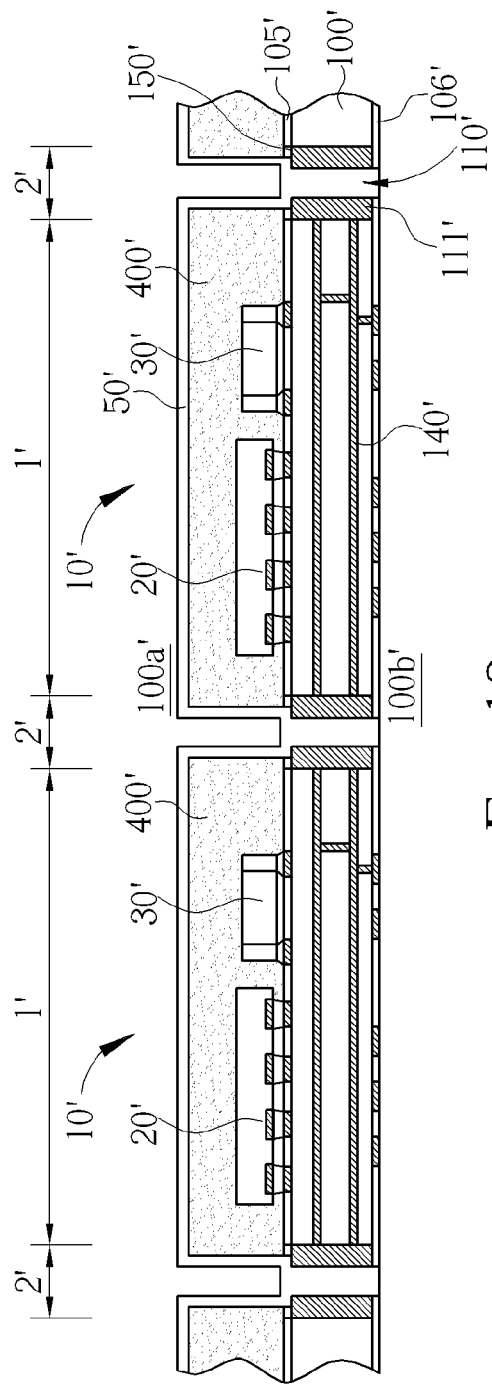

As shown in FIG. 12, an EM shielding layer 50' is conformally formed on the top surface 400a' and four sidewalls 400b' of each of the mold bodies 400'. According to the embodiment of the invention, the EM shielding layer 50' may be formed by using spraying methods, sputtering methods, electroplating methods, evaporating methods, or the like, and may comprise a conductive material, for example, a copper layer, but not limited thereto. The EM shielding layer 50' may further comprise a protective film such as epoxy resin, but not limited thereto. According to the embodiment of the invention, the EM shielding layer 50' fills into the via holes 110' and is electrically connected to the conductive layer 111' inside the via holes 110'.

As shown in FIG. 13, a second dicing process using blade sawing, wire sawing, or laser is performed to dice along the dicing region 2' to cut through the EM shielding layer 50', the conductive layer 111' inside the via holes 110', and the substrate 100', thereby singulating a plurality of semiconductor packages 10'. It is noteworthy that after the second dicing process, the EM shielding layer 50' is still electrically connected to the conductive layer 111' inside the via holes 110'. Finally, a plurality of bumps or balls (solder bumps or solder balls) 62' may be formed on the bottom side 100b' of the substrate 100'. According to another embodiment of the invention, as shown in FIG. 13A, the dicing width during the first dicing process may be equal to or greater than the via diameter of each of the via holes 110'.

Figure 17:
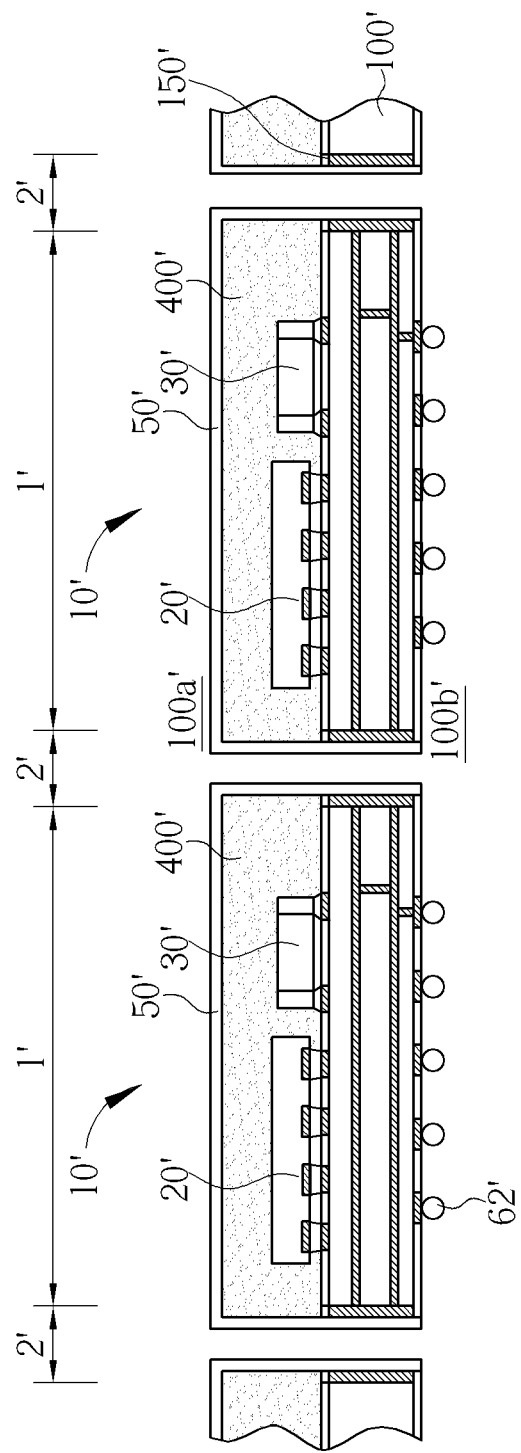

According to another embodiment of the invention, as shown in FIG. 15, a carrier film 200' may be adhered to the bottom side 100b' of the substrate 100'. Subsequently, a dicing process using blade sawing, wire sawing, or laser is performed to dice along the dicing region 2' to cut through the mold compound 40' and the via holes 110'. The cutting depth may reach the surface of the carrier film 200'. Thereafter, as shown in FIG. 16, the carrier film 200' is removed. As shown in FIG. 17, a conformal EM shielding layer 50' is formed. A plurality of bumps or balls (solder bumps or solder balls) 62' may be formed on the bottom side 100b' of the substrate 100' to thereby form a plurality of semiconductor packages 10'.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a substrate having a front side, a bottom side, and a sidewall along a perimeter of the substrate, wherein the substrate comprises a conductive via, a ground pad, and a ground layer, wherein the conductive via electrically connects the ground pad to the ground layer;
   a plurality of solder pads on the bottom side;
   at least one electromagnetic (EM) shielding contact structure on the bottom side and partially exposed from the sidewall;
   a semiconductor device mounted on the front side;
   a mold compound on the front side and covering the semiconductor device; and
   an EM shielding layer conformally covering the mold compound and the sidewall, wherein the EM shielding layer is in direct contact with a portion of the at least one EM shielding contact structure exposed from the sidewall.

2. The semiconductor package according to claim 1, wherein the at least one EM shielding contact structure is electrically connected to the ground layer through the conductive via.

3. The semiconductor package according to claim 1, wherein the conductive via electrically connects the ground pad to the ground layer, and the at least one EM shielding contact structure and the ground pad are structurally and electrically independent and separated from each other.

4. The semiconductor package according to claim 1 further comprising a filter device disposed on the substrate, wherein the filter device is electrically connected between the at least one EM shielding contact structure and the ground pad through at least two solder pads on the bottom side of the substrate or the front side of the substrate.

5. The semiconductor package according to claim 1, wherein the at least one EM shielding contact structure is disposed at a corner on the bottom side of the substrate.

6. The semiconductor package according to claim 1 further comprising a plurality of solder bumps or solder balls on the plurality of solder pads.

7. The semiconductor package according to claim 1, wherein the at least one EM shielding contact structure is covered by a solder mask on the bottom side.

8. A method for manufacturing a semiconductor package, comprising:

providing a substrate with a front side and a bottom side, wherein the substrate has a plurality of device regions thereon and a dicing region surrounding each of the device regions, wherein a plurality of solder pads and at least one electromagnetic (EM) shielding contact structure are formed on the bottom side, wherein the substrate comprises a conductive via, a ground pad, and a ground layer, wherein the conductive via electrically connects the ground pad to the ground layer;

mounting a semiconductor device on the front side of the substrate;

forming a mold compound to completely cover the front side of the substrate, wherein the mold compound covers the semiconductor device;

performing a dicing process to dice the mold compound and the substrate along the dicing region, thereby singulating a plurality of semiconductor packages and exposing a portion of the at least one EM shielding contact structure from a sidewall of the substrate; and forming a conformal EM shielding layer on each of the semiconductor packages, wherein the conformal EM shielding layer covers the mold compound and the sidewall of the substrate, and wherein the conformal EM shielding layer is in direct contact with the exposed portion of the at least one EM shielding contact structure.

9. The method for manufacturing a semiconductor package according to claim 8, wherein the at least one EM shielding contact structure is electrically connected to the ground layer through the conductive via.

10. The method for manufacturing a semiconductor package according to claim 8, wherein the conductive via electrically connects the ground pad to the ground layer, and the at least one EM shielding contact structure and the ground pad are structurally and electrically independent and separated from each other.

11. The method for manufacturing a semiconductor package according to claim 8 further comprising a filter device disposed on the substrate, wherein the filter device is electrically connected between the at least one EM shielding contact structure and the ground pad through at least two solder pads on the bottom side of the substrate or the front side of the substrate.

12. The method for manufacturing a semiconductor package according to claim 8, wherein the at least one EM shielding contact structure is disposed at a corner on the bottom side of the substrate.

13. The method for manufacturing a semiconductor package according to claim 8 further comprising a plurality of solder bumps or solder balls on the plurality of solder pads.

14. The method for manufacturing a semiconductor package according to claim 8, wherein the at least one EM shielding contact structure is covered by a solder mask on the bottom side.

15. The method for manufacturing a semiconductor package according to claim 8, wherein the conformal EM shielding layer is formed by using spraying methods, sputtering methods, electroplating methods, or evaporating methods.

* * * * *